United States Patent [19]

Jouanny

[11] 4,125,252

[45] Nov. 14, 1978

[54] POWER SEMICONDUCTOR ASSEMBLY AND THE METHOD AND APPARATUS FOR ASSEMBLY THEREOF

[75] Inventor: Robert Jouanny, Montreuil-sous-Bois, France

[73] Assignee: Jeumont-Schneider, France

[21] Appl. No.: 789,521

[22] Filed: Apr. 21, 1977

Related U.S. Application Data

[62] Division of Ser. No. 616,635, Sep. 25, 1975, Pat. No. 4,040,085.

[30] Foreign Application Priority Data

Oct. 1, 1974 [FR] France .................... 74 33035

[51] Int. Cl.² .............................................. B23Q 3/08
[52] U.S. Cl. .................... 269/47; 29/569 R; 269/258
[58] Field of Search ............... 29/569, 726, 757, 760; 269/258, 47, 52

[56] References Cited

U.S. PATENT DOCUMENTS

| | | | |
|---|---|---|---|
| 1,015,171 | 1/1912 | Goble | 269/258 |
| 3,071,368 | 1/1963 | Harding | 269/258 |

Primary Examiner—W. Tupman
Attorney, Agent, or Firm—Robert E. Burns; Emmanuel J. Lobato; Bruce L. Adams

[57] ABSTRACT

A power semiconductor assembly in which two metallic heat sinks with inner planar surfaces clamp between these surfaces a housing of a power semiconductor therein at a set clamping pressure. The casing has planar surfaces against which the inner planar surfaces of the heat sinks are clamped. Three threaded rod assemblies are assembled in three sets of recesses on the heat sinks controlling the pressure applied to the semiconductor assembly. Each heat sink has three recesses communicating with outer surfaces thereof aligned axially with corresponding similar recesses of the other heat sink. The rod assemblies each have a pair of threaded rods joined coaxially by a molded element made of, for example, porcelain, or a resin epoxy such as "Araldite", or a mica-glass composition. Nuts are threaded on the two rods and a calibrated elastic washer on one rod hold the entire assembly at the desired clamping pressure. The power semiconductor assembly is assembled in a press in which the heat sinks with the semiconductor clamped therebetween are compressed to a given level and then the nuts of the rod assemblies tightened and the pressure of the press released so that the rod assemblies relax to the desired clamping pressure desired to be applied to the housing between the heat sinks.

1 Claim, 1 Drawing Figure

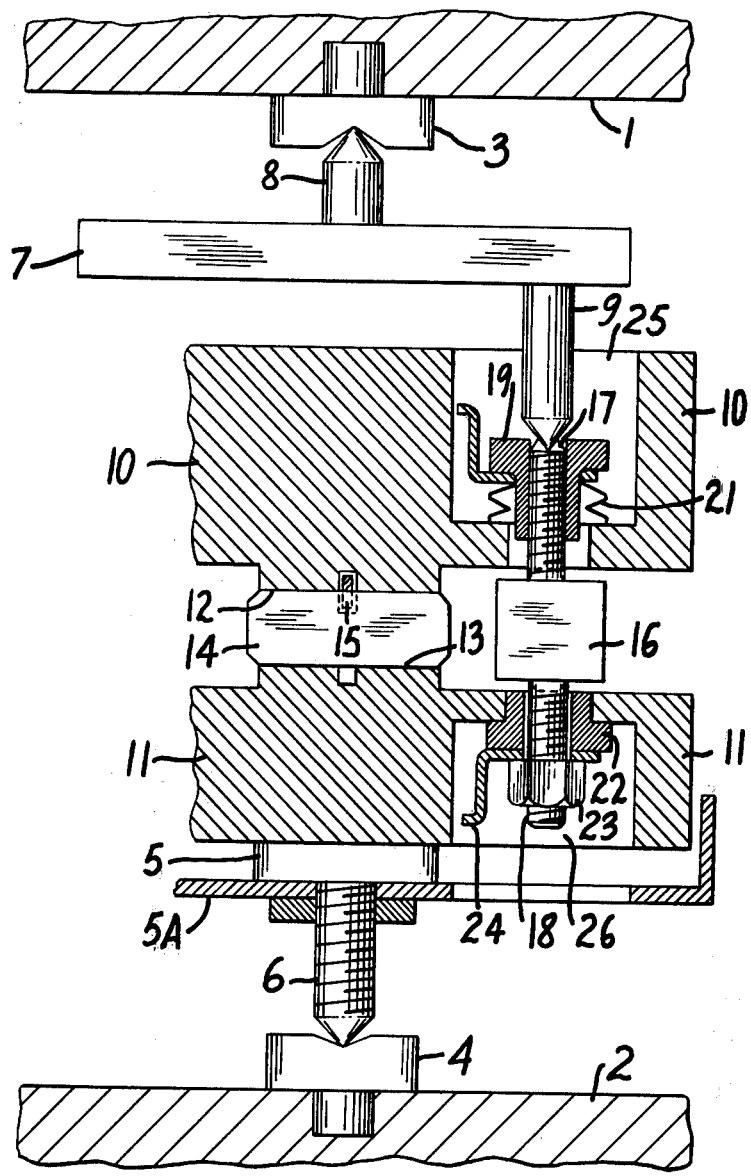

POWER SEMICONDUCTOR ASSEMBLY AND THE METHOD AND APPARATUS FOR ASSEMBLY THEREOF

This is a divisional of application Ser. No. 616,635, filed Sept. 25, 1975, now U.S. Pat. No. 4,040,085.

The present invention concerns a process for the clamping of a power semi-conductor housing mounted between two radiators and the apparatus for the carrying out of this process. It applies in particular to the mounting of semi-conductors for carrier-borne traction equipment for which savings in space and weight are of prime importance.

The semi-conductors used in this case are thyristors or diodes which must be mounted between two radiators, the latter assuring the removal of the heat by pulsating air ventilation on the one hand and serving as connections with the faces of these semi-conductors on the other hand. Due to equipment or reduced size, one can thus evacuate the large amount of power dissipated in the junction of power semi-conductors. The housing containing the junction is in the form of a cylindrical pellet one of the faces of which has a small central recess in order, if so desired, to receive one of the ends of a centering rod. The heat liberated in the junction is transmitted to the radiators by the two faces of housing, which are in close contact with the corresponding faces of the two radiators. The two contact faces of the housing serve as electrodes for the semi-conductor, the operating voltage being applied between the two radiators.

In the known methods of clamping for this type of semi-conductor, the housing is clamped between its two radiators by means of two rigid metallic plates connected by three insulated rods and insulated clamping nuts. The three rods are arranged parallel to each other, at an equal distance from the housing, in order to balance the clamping force on the latter. Each of the two plates rests against the outer face of the corresponding radiator via one or more elastic washers placed at the center of the plates nd intended to compensate for inequalities of expansion between rods and radiators during the operation of the semi-conductor. One can also use clampings with two or four rods, but this latter case has the drawback of being hyperstatic.

The clampings in accordance with these processes have the drawback of taking up a lot of space and of requiring long rods which, passing through the ribs of the radiators, interfere with their ventilation and make their insulation more difficult to effect.

In order for a semi-conductor of this type to operate properly, particularly from the point of view of the warming-up thereof, it is necessary on the one hand that the clamping force of the housing between the two radiators be within a range indicated by the manufacturer and on the other hand that it be distributed uniformly over each of the two contact surfaces between housing and radiators. When these conditions are satisfied, the heat exchange between the housing and radiators is sufficiently good to assure the junction a temperature which permits it to have a normal life.

Now, in accordance with the three-rod clamping system cited above, the nuts are screwed on the corresponding rods by means of a tongue wrench. The total clamping force obtained on the housing is not precisely known. One is not certain either that this clamping force is distributed uniformly over the housing by three rods.

During the operation of the semi-conductor, the difference in temperature between the rods and the radiator on the one hand and the difference in the coefficients of expansion of the radiators (aluminum alloy) and the rods (steel) on the other hand, may result in an excessive true clamping force, the compensation by the elastic washers not being perfect.

Furthermore, a lack of parallelism between the faces of the housing has the result that the pressure is not uniform on the contact surfaces, which may even cause a sliding of the housing on the radiators, particularly when a centering rod is not used. Hot points may appear on the junction, resulting in a decrease of its life or even its rapid destruction.

With the process in accordance with the invention a dial press is used in order to know precisely the clamping force applied to the housing and furthermore a clamping tool which makes it possible to transmit uniform pressure to each of the two surfaces of contact of the housing with its radiators, even in the event that these contact surfaces have a defect in parallelism. Furthermore, as the two radiators serve as clamping plates for the housing, the space taken up by the system is slight. The flat shape selected for the radiators makes it possible to use clamping rods of short length. The ventilation of the radiators is improved. The insulating central portion of the clamping pieces used for the radiators serves as insulation between them.

The process of the invention is characterized by:

placing the said housing betwen its upper radiator and its lower radiator, the contact surfaces having been previously machined;

applying to the radiators, by means of a dial press, clamping forces which are about 25% greater than the clamping force E which is desired on the housing, by means of two swingable plates so as to transmit only pressure forces which are perpendicular to each contact surface and so that one of the plates exerts its pressing force directly on the clamping parts of the radiators, these parts being distributed around the housing along three equidistant axes;

without changing the adjustment of the press, each of the three clamping parts is clamped in succession with a clamping force equal to about 1% of E, and the equality of the corresponding three forces is checked by means of the dial of the press;

finally, the action of the press is removed.

The apparatus for the carrying out of this process is characterized by the fact that it comprises:

a first circular plate provided with a central pivot at its upper portion and at its lower portion three rods with conical ends which are parallel to the central pivot and arranged at the apices of an equilateral triangle which is centered on the said plate;

a second circular plate, provided with a central pivot at its lower portion, and with a centering piece at its upper portion;

two sockets, one fastened on the upper portion of the press and receiving the end of the central pivot of the first plate, and the other fastened on the lower portion of the press and receiving the end of the central pivot of the second plate;

three clamping pieces for the two radiators, each comprising two threaded rods, connected together by an insulating molding, as well as calibrated elastic washers.

The invention will be better understood from the following description and the sole accompanying FIG- URE of the drawing which shows the apparatus used for the clamping of a thyristor or diode housing between its two radiators.

The FIGURE shows the upper portion 1 and the lower portion 2 of a dial press, the corresponding sockets 3 and 4, a first circular plate 7 provided with a central pivot 8 and three rods 9 with conical ends (only one of these rods being shown in the FIGURE), a second circular plate 5 provided with its centering piece 5A and a central pivot 6, two radiators 10 and 11 and their respective surfaces of contact 12 and 13 with the housing 14, a rod 15 for centering the housing on the radiator 10 and one of the three identical clamping parts comprising two threaded rods 17 and 18 connected together by an insulating molding 16, three superposed elastic washers 21, a nut 19 having a bushing to center the elastic washers 21, a nut lock 20, a spacer 22, a nut 23 and a nut lock 24. The radiators 10 and 11 are provided with three recesses 25 and 26 respectively to receive the threaded rods 17 and 18.

The parts 5A, 10, 11, 19, 20, 22, 24 are shown in cross section.

The process in accordance with the invention takes place in the following manner:

The radiator 10 is taken, holding it in the position shown in the drawing; thereupon for each clamping piece there are placed on the elastic washers 21, the nut lock 20, and the nut 19 in the corresponding recess 25. The threaded rod 17 of the clamping piece is screwed into the nut 19 so that the central portion 16 of the clamping piece and the elastic washers 21 are in contact with the radiator without clamping.

The assembly which has just been mounted is turned upside down. The contact surface 12 of the radiator 10 is coated with compound grease. The surfaces of contact between the radiators and the housing have been previously machined, the surface of these machinings being of a quality of the order of 0.8 to 1.6 micrometer and of very good planarity. The contact surface 12 must be cleaned well before being coated with grease.

The centering rod 15 is grasped in the position which it occupies in the FIGURE, and placed in the recess provided for it on the radiator 10. Similarly, the housing 14 is grasped as shown in the FIGURE and turned upside down in order to be placed on the contact surface 12 and centered on the centering rod 15. The radiator 11 is taken holding it in the position which it occupies in the FIGURE; its contact surface 13 is coated with compound grease, taking the same precautions as previously, and it is turned upside down to place its contact surface 13 on the housing 14.

Now then, the threaded rods 18 are put in place in the corresponding recesses 26. For each clamping part the spacer 22 is then placed in the recess 26, and the nut lock 24 and the nut 23 which is screwed by hand without locking.

The assembly thus formed by the two radiators clamping the housing by means of the three clamping parts is turned upside down to come into the position indicated in the FIGURE.

The sockets 3 and 4 being fastened to the upper part and lower part respectively of the press, the aforesaid assembly is placed in the clamping tool comprising the two circular plates 5 and 7 in the following manner:

One takes the second circular plate 5 provided with its centering part 5A and on which the radiator 11 supporting the aforementioned assembly is placed.

The conical ends of the three rods 9 are placed in the conical recesses of the ends of the threaded rods 17. The new assembly thus formed between the central pivots 6 and 8 is placed under the press, the pivots 6 and 8 resting on the sockets 4 and 3 respectively.

By means of the central pivots 6 and 8 a force of 5,900 N is applied with the press, as indicated by the dial of the press. The elastic washers 21 flex, the clamping parts being pushed downward. The threaded rods 18 slide in the spacers 22 preventing the insulating molding 16 from working in compression. A sufficient distance has been provided between the insulating molding 16 and the radiator 11 so that at the end of the stroke the insulating molding 16 touches neither the radiator 11 nor the spacer 22. Leaving the force which has been previously applied, the nuts 23 are screwed with a wrench to place the spacers, nut locks and nuts in contact. The press must not indicate any change in force during this operation.

Each of the nuts 23 is then tightened successively by the wrench by a value of 50 N indicated by the corresponding downward travel of the needle of the dial of the press. This value of 50 N is selected as a function of the sensitivity of the press (about 1%). At the end of the operation, the dial of the press indicates a clamping force reduced to 5,750 N. The actual charge borne by the housing is then 6,050 N.

The action of the press is eliminated and the true clamping force of the housing is reduced to 4,700 N as the result of a relaxation which it was able to measure by means of a gauge. This systematic relaxation is due to the final flexing of the radiators, to the elongation of the threaded rods and to the compacting of the parts in contact. Therefore one knows precisely the final clamping force exerted on the housing and it has been verified that it is within the range indicated by the manufacturer.

By a test mounting comprising a gauge one can verify that the clamping force on the housing remains unchanged after the clamping force of the press has been eliminated, or stated differently, that the relaxation observed after the elimination of the action of the press is not followed by any additional relaxation.

The invention applies in particular to the mounting of semi-conductors for carrier-borne traction equipment.

What is claimed is:

1. Apparatus for clamping at a selected pressure power semiconductors for assembly with radiators comprising, a support socket, and another socket movable toward and away from said support socket, a support plate having a central pivot extending from the plate and removably resting on the support socket, a clamping plate having an upstanding central pivot extending from the plate and removably seated on said another socket and having three rods extending from the clamping plate in a direction opposite to said central pivot thereof and parallel thereto, each rod having a conical tip portion, said rods being disposed with said tips thereof disposed at points corresponding to apices of an equilateral triangle, a centering piece having an opening through which said central pivot of said support plate extends for resting on said another socket, said centering plate having a peripheral rim and openings spaced in alignment with said rods, whereby a power semiconductor and housing thereof are disposable between two heat sinks each having three recesses on the margin and each having a through hole opening into said recess, each said recesses receiving a fastener assembly for assemblying the heat sinks together, each fastener assembly having a threaded rod extending through the corresponding hole in said recess for clamping an insulator therebetween and nuts on said rods for varying pressure applied to said insulator, and said openings in the centering plate being disposed to align with said recesses.

\* \* \* \* \*